(12) United States Patent
Alam et al.

(10) Patent No.: US 10,505,538 B1
(45) Date of Patent: Dec. 10, 2019

(54) DYNAMIC GATE DRIVE SYSTEM AND CONTROL METHOD

(71) Applicant: GM Global Technology Operations LLC, Detroit, MI (US)

(72) Inventors: Mohammed K Alam, Canton, MI (US); Mohammad N. Anwar, Van Buren Township, MI (US); Syed M. Kadry, Grand Blanc, MI (US); Korobi Basher, Rochester Hills, MI (US); Goro Tamai, Bloomfield Hills, MI (US); William R. Cawthorne, Milford, MI (US); Subramanian Vadula, Novi, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 0 days.

(21) Appl. No.: 16/268,972

(22) Filed: Feb. 6, 2019

(51) Int. Cl.
  *H03K 17/687* (2006.01)
  *H03K 19/003* (2006.01)

(52) U.S. Cl.
  CPC ... *H03K 17/6871* (2013.01); *H03K 19/00369* (2013.01)

(58) Field of Classification Search
  CPC ............ H03K 17/6871; H03K 19/003; H03K 19/00307; H03K 19/00315; H03K 19/00369

USPC ......................... 327/108, 109, 110, 111, 112
See application file for complete search history.

(56) References Cited

U.S. PATENT DOCUMENTS

| | | | |
|---|---|---|---|
| 2012/0206055 A1* | 8/2012 | Tseng ................. | H05B 33/0818 315/186 |
| 2014/0266325 A1* | 9/2014 | Tang .................... | H03K 17/107 327/109 |

* cited by examiner

*Primary Examiner* — William Hernandez
(74) *Attorney, Agent, or Firm* — Quinn IP Law (57) ABSTRACT

A switching circuit includes a semiconductor switch having a Gate terminal, and includes first, second, third, and fourth Gate resistors. The Gate resistors have upstream and downstream ends relative to a location of the semiconductor switch or a driven load. The downstream ends connect to the Gate terminal. First, second, third, and fourth buffer switches have Gate terminals and Source terminals, with the Source terminals connected to the upstream ends of the first, second, third, and fourth Gate resistors, respectively. An optional Gate driver integrated circuit (IC) connects to the Gate terminals of the buffer switches. A microcontroller, responsive to circuit measurements, selects switching control values and Gate resistor identities based on the measurements, and transmits switching control signals and a Gate resistor selection signal to select on/off states of the buffer switches and an optimum switching speed for the semiconductor switch.

20 Claims, 9 Drawing Sheets

|  |  | Reg - 1 | Reg - 2 | Reg - 3 |
|---|---|---|---|---|
|  | Rg Code (13) | 01 | 10 | 11 |
| ON/OFF | ON | $R_{g1\_ON}$ | $R_{g2\_ON}$ | $R_{g1\_ON}||R_{g2\_ON}$ |
|  | OFF | $R_{g1\_OFF}$ | $R_{g2\_OFF}$ | $R_{g1\_OFF}||R_{g2\_OFF}$ |
| STAT | $S_a$ | PWM | OFF | PWM |
|  | $S_b$ | OFF | PWM | PWM |
|  | $S_c$ | PWM | OFF | PWM |
|  | $S_d$ | OFF | PWM | PWM |

$R_{g1\_ON} > R_{g2\_ON}; R_{g1\_OFF} > R_{g2\_OFF}$

| States | SH1 | SH2 | SL1 | SL2 | SH3 | SH4 | SL3 | SL4 | Fault |
|---|---|---|---|---|---|---|---|---|---|
| 21 | 0 | 0 | 0 | 1 | 0 | 1 | 0 | 0 | Region - 2 - Mid Current (Dn) |
| 25 | 0 | 0 | 0 | 1 | 1 | 0 | 0 | 0 | Wrong selection between up & Dn gate Rg |
| 29 | 0 | 0 | 1 | 1 | 1 | 1 | 0 | 0 | Wrong selection between up & Dn gate Rg |
| 37 | 0 | 0 | 1 | 0 | 0 | 1 | 0 | 0 | Wrong selection between up & Dn gate Rg |
| 41 | 0 | 0 | 1 | 0 | 1 | 0 | 0 | 0 | Region - 1 - Hi Current (Dn) |
| 45 | 0 | 0 | 1 | 1 | 1 | 1 | 0 | 0 | Wrong selection between up & Dn gate Rg |
| 53 | 0 | 0 | 1 | 1 | 0 | 1 | 0 | 0 | Wrong selection between up & Dn gate Rg |
| 57 | 0 | 0 | 1 | 1 | 1 | 0 | 0 | 0 | Wrong selection between up & Dn gate Rg |
| 61 | 0 | 0 | 1 | 1 | 1 | 1 | 0 | 0 | Region - 3 - Lo Current (Dn) |
| 66 | 0 | 1 | 0 | 0 | 0 | 0 | 0 | 1 | Region - 2 - Mid Current (Up) |
| 67 | 0 | 1 | 0 | 0 | 0 | 0 | 1 | 0 | Wrong selection between up & Dn gate Rg |
| 68 | 0 | 1 | 0 | 0 | 0 | 0 | 0 | 1 | Wrong selection between up & Dn gate Rg |
| 130 | 1 | 0 | 0 | 0 | 0 | 0 | 1 | 1 | Wrong selection between up & Dn gate Rg |
| 131 | 1 | 0 | 0 | 0 | 0 | 0 | 1 | 0 | Region - 1 - Hi Current (Up) |
| 132 | 1 | 0 | 0 | 0 | 0 | 0 | 0 | 1 | Wrong selection between up & Dn gate Rg |
| 194 | 1 | 1 | 0 | 0 | 0 | 0 | 1 | 1 | Wrong selection between up & Dn gate Rg |
| 195 | 1 | 1 | 0 | 0 | 0 | 0 | 1 | 0 | Wrong selection between up & Dn gate Rg |
| 196 | 1 | 1 | 0 | 0 | 0 | 0 | 1 | 1 | Region - 3 - Lo Current (Up) |

DYNAMIC GATE DRIVE SYSTEM AND CONTROL METHOD

INTRODUCTION

Solid-state semiconductor switches are used in a wide variety of power electronic devices. In high-power applications, for instance, semiconductor switches are integral to the internal switching construction of power inverter modules, voltage converters, power amplifiers, and switching power supplies. In an electrical circuit having a polyphase electric machine, the individual phase legs of the machine's alternating-current (AC) side are electrically connected to a corresponding pair of semiconductor switches of a power inverter module. A direct-current (DC) side of the power inverter module is electrically connected to positive and negative rails of a DC voltage bus, which in turn is connected to a multi-cell battery pack or another DC power supply.

In a power inversion process, pulse width modulation, pulse density modulation, delta-sigma modulation, pulse-frequency modulation, or other application-suitable binary (on/off) switching control signals are transmitted to individual semiconductor switches located within the power inverter module. The control signals serve to alternate the conducting state of the switches and thereby generate an AC voltage waveform. The process may be reversed, such that an AC voltage waveform supplied to the power inverter module is rectified and output as a DC voltage waveform suitable for energizing the DC voltage bus or components connected thereto.

Semiconductor switches of the types used in high-power applications are typically voltage-controlled, with two common switch designs being the Metal Oxide Field-Effect Transistor (MOSFET) and the Insulated-Gate Bipolar Transistor (IGBT). A MOSFET has three terminals: an input terminal/Gate, an output terminal/Drain, and a common terminal/Source. A threshold voltage transmitted to the Gate terminal causes a MOSFET to transition to a conducting state. An IGBT, which is generally well suited to high-speed/high-power switching operations, is another three-terminal switch having a Gate terminal, with the remaining two IGBT terminals referred to as the Collector and the Emitter. An IGBT is switched to a conducting state by applying a threshold voltage between the Gate and Emitter terminals, and then turned off again by reducing the Gate-Emitter voltage to zero or a negative voltage.

SUMMARY

The present disclosure relates to switching circuit topologies and related control methods for use in a system when powering a driven load, e.g., a polyphase electric machine or a resistive load. In particular, a dynamic Gate drive system and control method are disclosed that together address limitations of certain circuit topologies tailored to the worst-case sizing of Gate resistance. Switching behavior of a given semiconductor switch is largely governed by the switch's Gate capacitance, with charging and discharging affected by the Gate resistance proximate the Gate terminal. In order to protect sensitive semiconductor switch hardware from damage from excessive voltage overshoot, i.e., across Collector and Emitter terminals of an IGBT or across Drain and Source terminals of a MOSFET, Gate resistance is typically chosen to satisfy worst-case voltage and current operating conditions. Such approaches tend to limit the maximum efficiency and level of phase currents when performing switching operations under nominal operating conditions. The present approach is intended to address this potential limitation.

In particular, the optimization strategy enabled by the present disclosure collects a set of circuit measurements at each switching instance. For instance, the circuit measurements may include a temperature of a semiconductor switch, e.g., a chip or switch junction temperature, a direct-current (DC) bus voltage, and an instantaneous phase current value. The measurements are relayed to a microcontroller and thereafter used, in real-time, to determine appropriate Gate resistance values for the microcontroller to switch into a conductive path leading to a controlled downstream semiconductor switch.

Responsive to the collected circuit measurements, an operating mode-specific pair of Gate resistors is switched into the above-noted conductive path, with two pairs of Gate resistors used herein in an embodiment and controlled by a corresponding pair of buffer switches. More Gate resistors and/or buffer switches may be used in alternative embodiments. Therefore, for each controlled semiconductor switch in a given circuit, the switch operation is regulated by four buffer switches and four Gate resistors. The particular pair of Gate resistors may be selected based on recorded values, e.g., one or more lookup tables referenced by the received circuit measurements, and/or selected based on calculated values as described herein. Switching control and Gate resistor selection signals are fed by the microcontroller to a Gate driver integrated circuit (IC) associated with the controlled semiconductor switch. Thus, the Gate driver IC is associated with a given controlled semiconductor switch in a particular embodiment, with the microcontroller possibly controlling multiple Gate driver ICs.

The values may be optionally contained in the lookup table and based on a corresponding performance operating region of the semiconductor switch and/or its driven load, e.g., the above-noted polyphase electric machine or a resistive load. The operating regions may be defined as a performance map in certain configurations by the instantaneous phase currents and the DC bus voltage, with each map having a corresponding switch temperature or range thereof. A resulting reduction in voltage overshoot of the controlled semiconductor switch may enable use of higher-amplitude phase currents and reduced switching chip size and cost, among other potential benefits and performance advantages as detailed herein.

In a possible embodiment, the switching circuit may include a voltage-controlled semiconductor switch having a Gate terminal. The switching circuit may also include, in an example embodiment, at least first, second, third, and fourth Gate resistors arranged in two pairs, as noted above. Each Gate resistor has a respective upstream and downstream end located farther or closer to the semiconductor switch, respectively. The downstream ends are electrically connected to the Gate terminal of the semiconductor switch. Additionally, the switching circuit includes first, second, third, and fourth buffer switches each having respective Gate and Source terminals. The Source terminals are connected to the upstream ends of the first, second, third, and fourth Gate resistors, respectively.

In this non-limiting embodiment, a Gate driver IC is connected to the Gate terminals of each of the buffer switches. The microcontroller is configured, responsive to a received set of circuit measurements, to access a lookup table indexed by the circuit measurements, and then to select switching control values and Gate resistor identities based on the circuit measurements. The microcontroller transmits binary (on/off) switching control signals and a Gate resistor selection signal to the Gate driver IC to select a respective on/off state of each the buffer switches, an action which has the effect of selecting a particular Gate resistance. The Gate resistor selection signal ultimately selects the on/off switching state of the buffer switches connected to the upstream ends of the resistors, with buffer switches in a conducting state passing voltage/current to the controlled downstream semiconductor switch.

The semiconductor switch may be an IGBT and the buffer switches may be embodied as MOSFETs in a non-limiting example embodiment.

An optional clamp circuit may be used that has one or more Zener diodes. Such a clamp circuit may be electrically connected to the semiconductor switch, with the clamp circuit configured to increase Gate voltage in response to a threshold voltage across the semiconductor switch.

The clamp circuit in certain disclosed embodiments is an active clamp circuit connected to the optional Gate driver IC, with the Gate driver IC programmed to command a default switching state of the buffer switches responsive to detection of the threshold voltage. Alternatively, the clamp circuit may be a passive clamp circuit connected to the Gate terminal of the semiconductor switch and not connected to the Gate driver IC.

The switching circuit may include the driven load, with the driven load connected to the semiconductor switch.

The disclosed switching circuit may be used as part of an electrical system having a DC voltage bus and a polyphase electrical machine driven by a plurality of phase currents, e.g., three phase currents in an exemplary three-phase implementation. In such an embodiment, the set of circuit measurements may include a voltage level of the DC voltage bus, an instantaneous value of the phase currents, and a temperature of the semiconductor switch, e.g., a junction or chip temperature, with the driven load in this example configuration being the polyphase electric machine.

The microcontroller may be programmed with a performance map defining a plurality of (two or more) different operating regions indexed, for a given temperature, by the voltage level and instantaneous phase currents, i.e., a relative power level. The microcontroller may determine a present operating region of the driven load on the performance map, e.g., as a corresponding point on the performance map, using the circuit measurements, and then select the particular pair or pairs of Gate resistors based on the present operating region.

The microcontroller may also be programmed with a table of fault codes corresponding to different logic state combinations of the buffer switches, and to execute a control action using the table of fault codes responsive to detecting one of the logic state combinations.

The table of fault codes may include 256 total fault codes, with twelve of the 256 total fault codes corresponding to an incorrect selection of the Gate resistors by the microcontroller.

According to another aspect of the present disclosure, a method is provided for controlling a semiconductor switch when such a switch is connected to a driven load via a switching circuit. The method includes receiving circuit measurements using a microcontroller, with the microcontroller possibly being in communication with an optional Gate driver IC, and then determining switching control values and Gate resistor identities based on the values of the circuit measurements. The method further includes transmitting on/off switching control signals and a Gate resistor selection signal, respectively corresponding to the switching control values and the Gate resistor identities, to the Gate driver IC via the microcontroller, or directly using the microcontroller or other control logic. This action selects a respective on/off state of the intervening buffer switches when driving the driven load.

The above summary is not intended to represent every possible embodiment or every aspect of the present disclosure. Rather, the foregoing summary is intended to exemplify some of the novel aspects and features disclosed herein. The above features and advantages, and other features and advantages of the present disclosure, will be readily apparent from the following detailed description of representative embodiments and modes for carrying out the present disclosure when taken in connection with the accompanying drawings and the appended claims.

The present disclosure is susceptible to modifications and alternative forms, with representative embodiments shown by way of example in the drawings and described in detail below. Inventive aspects of this disclosure are not limited to the disclosed embodiments. Rather, the present disclosure is intended to cover modifications, equivalents, combinations, and alternatives falling within the scope of the disclosure as defined by the appended claims.

DETAILED DESCRIPTION

Figure 1:
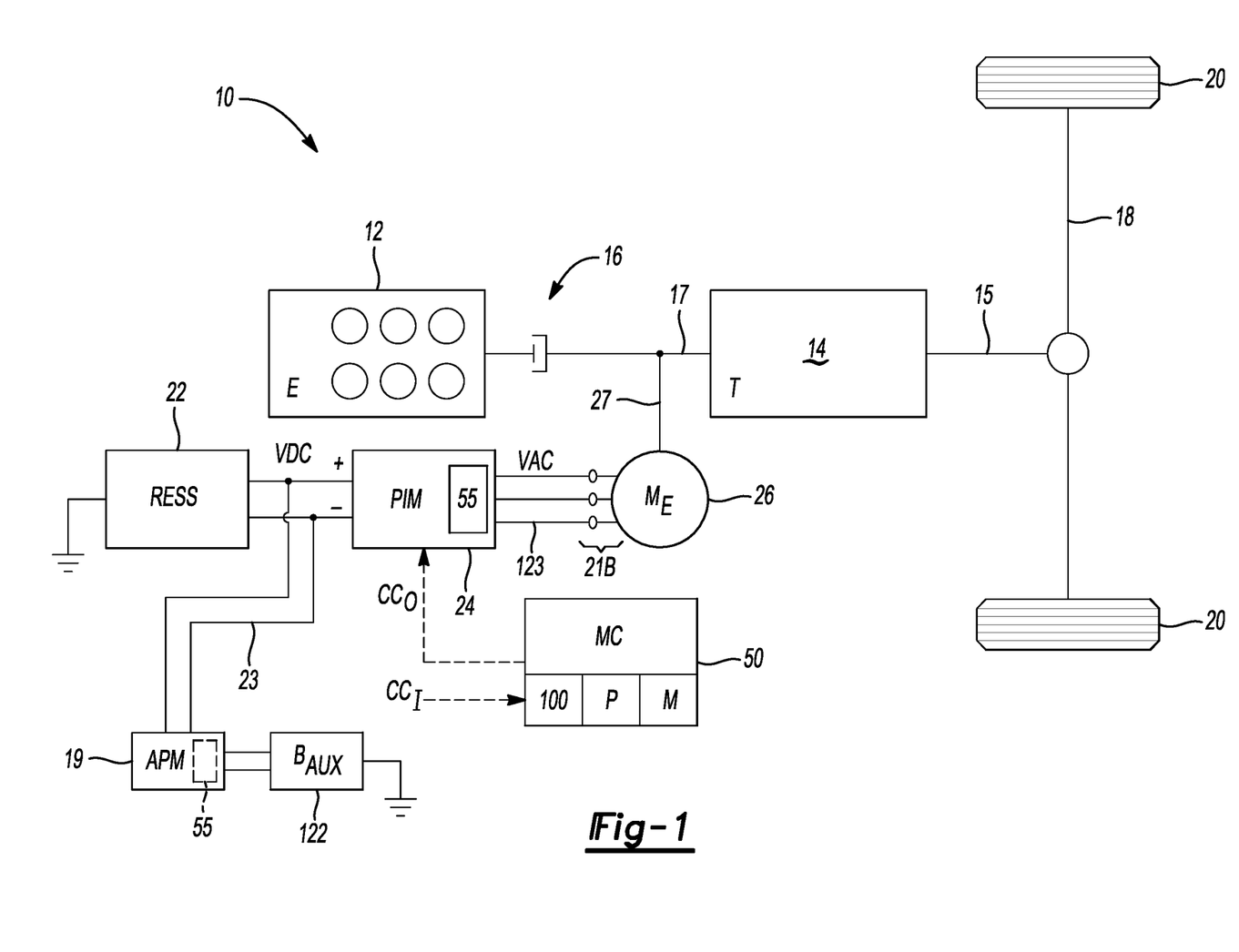
FIG. 1 is a schematic illustration of a powertrain system within an example motor vehicle, with a driven load in the form of a polyphase electric machine, and with the electric machine powered via a switching circuit as disclosed herein.

Referring to the drawings, wherein like reference numbers refer to the same or like components in the several Figures, a powertrain system 10 is depicted schematically in FIG. 1. For illustrative purposes, the powertrain system 10 is shown as part of a motor vehicle. However, the present teachings may be applied in other mobile or stationary electrical systems in which high-speed electrical switching operations are performed. Those of ordinary skill in the art will appreciate that the above-noted switching operations are performed in various types of vehicles, e.g., motor vehicles, rail vehicles, aircraft, and watercraft, in drive systems of mobile platforms and robotic applications, as well as in powerplants, hoist systems, conveyors, plant equipment, etc. The powertrain system 10 of FIG. 1 shown in a motor vehicle context is therefore just one possible example application, which is used hereinafter for illustrative consistency without limiting the scope of the disclosure to such an embodiment.

The powertrain system 10 includes an electric switching circuit 55 that is constructed and controlled as set forth below with reference to FIGS. 2-9. The switching circuit 55 is depicted as an integral part of a power inverter module (PIM) 24 used for driving a polyphase electric machine (ME) 26. Therefore, in the non-limiting illustrated example application, the powertrain system 10 also includes a rechargeable energy storage system (RESS) 22, e.g., a multi-cell lithium ion or nickel-metal hydride battery pack. The powertrain system 10 may also include one or more prime movers, such as an internal combustion engine (E) 12 and a planetary transmission (T) 14 or gear set, with the engine 12 coupled to the transmission 14 via an input clutch 16. An output member 15 of the transmission 14 powers one or more drive axles 18 and, in the illustrated example motor vehicle embodiment, ultimately delivers propulsion torque to a set of road wheels 20.

The RESS 22, being a direct-current (DC) energy storage system, is electrically connected to a DC-side of the PIM 24 via positive (+) and negative (−) bus rails of a DC voltage bus 23. An alternating current (AC)-side of the PIM 24 is connected to a corresponding AC voltage bus 123, with the AC voltage bus 123 terminating in phase leads or windings of the electric machine 26 in the illustrated example embodiment of FIG. 1.

A switching operation of the PIM 24 using the switching circuit 55 ultimately delivers an AC voltage (VAC) that energizes the electric machine 26. Sensors 21B (also see FIG. 2) may be used to measure the phase currents of the electric machine 26, with two or three such sensors 21B usable for the example three-phase embodiment of FIG. 1 as will be appreciated by those of ordinary skill in the art. The energized electric machine 26 in turn generates motor torque that rotates a rotor 27 of the electric machine 26. The rotor 27 may be mechanically coupled to an input member 17 of the transmission 14, such that the electric machine 26 is configured as another prime mover in a hybrid electric embodiment of the powertrain system 10, or as the sole prime mover in a battery electric version of the powertrain system 10 when the engine 12 is omitted.

The powertrain system 10 may also include an auxiliary power module (APM) 19 that is electrically connected to the DC voltage bus 23 as shown. The APM 19 may be configured as a DC-DC voltage converter capable of reducing the voltage level from a level present on the DC voltage bus 23 to an auxiliary/low-voltage level suitable for charging an auxiliary battery ($B_{AUX}$) 122 and/or connected low-voltage systems. In a motor vehicle application as shown, for instance, the auxiliary battery 122 may be a 12-15V lead-acid battery. The switching circuit 55 described herein as part of the PIM 24 may be used in the alternative to perform switching functions of the APM 19, as shown in broken outline within the APM 19, or other electronic devices not shown in the Figures, e.g., power amplifiers and switching power supplies.

The powertrain system 10 of FIG. 1 includes a microcontroller (MC) 50 that is in communication with the PIM 24 and the electric machine 26, e.g., over a controller area network, serial peripheral interface (SPI) connection, or another suitable communications link or protocol. Although depicted as a unitary device, the microcontroller 50 may be alternatively configured as a distributed control network of control devices. Connectivity of the microcontroller 50 to the PIM 24 and the electric machine 26 may include various other transfer conductors and/or wireless control links suitable for transmitting/receiving control and feedback signals (arrow $CC_O$), with the control and feedback signals (arrow $CC_O$) including switching control signals 13 and a Gate resistor selection signal ($R_g$), both of which are show in FIG. 3 and described in further detail below.

The microcontroller 50 includes a microprocessor (P) and tangible, non-transitory memory (M), including read only memory in the form of optical, magnetic, or flash memory. The microcontroller 50 may also include sufficient amounts of random-access memory and electrically-erasable programmable read only memory, as well as a high-speed clock, analog-to-digital and digital-to-analog circuitry, and input/output circuitry and devices, as well as appropriate signal conditioning and buffer circuitry. Computer-readable instructions are recorded in memory (M) embodying a method 100, and example of which is disclosed later below with reference to FIG. 9. Execution of such logic by the processor (P), which is performed responsive to receipt of a set of input signals (arrow $CC_I$) inclusive of measured performance values of the switching circuit 55, ultimately causes the microcontroller 50 to regulate operation of the switching circuit 55.

Figure 2:
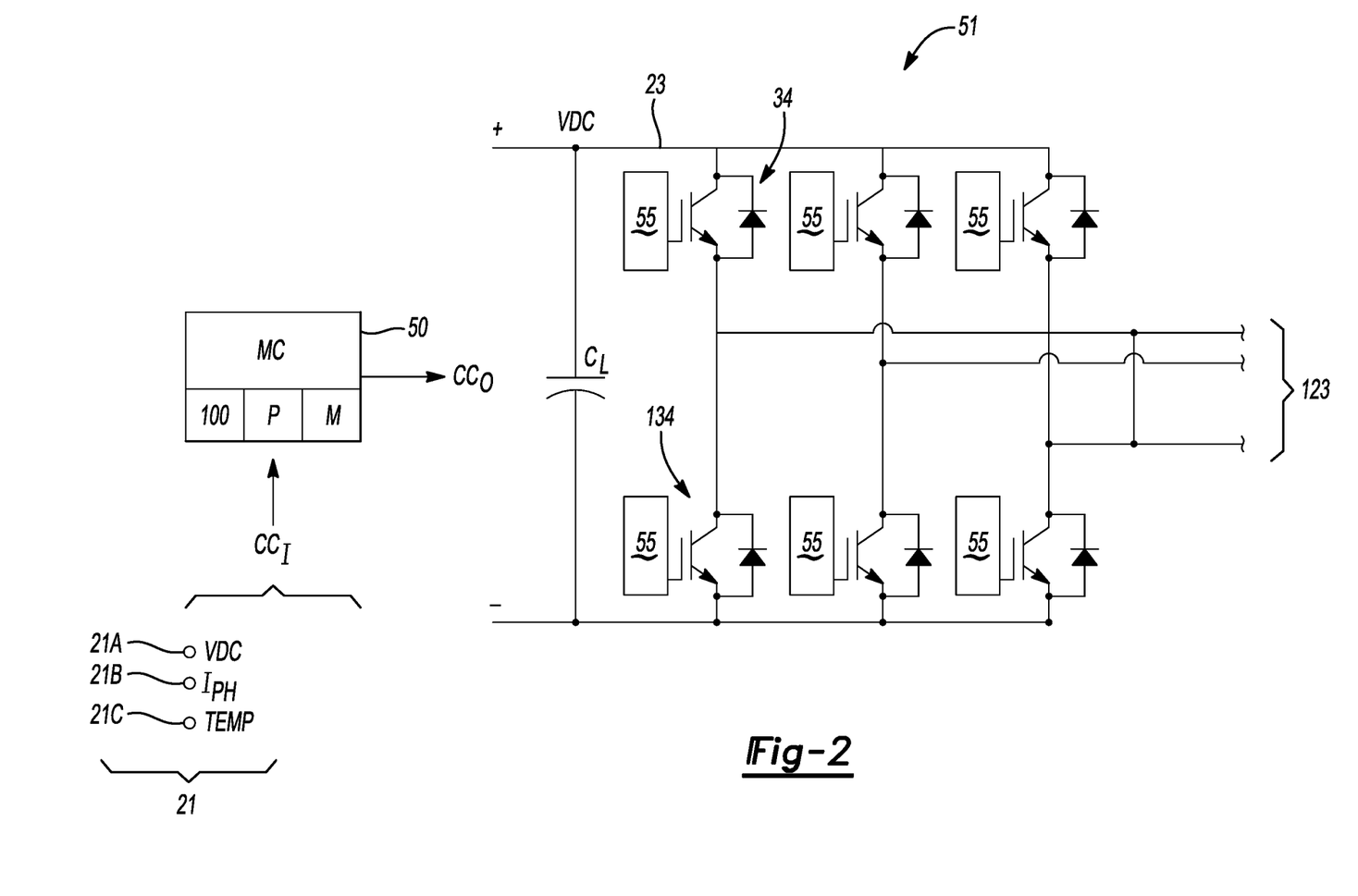
FIG. 2 is a schematic illustration of a switching circuit topology used with an example three-phase electric machine implementation.

Referring to FIG. 2, an electrical circuit 51 includes the microcontroller 50 and a plurality of switching circuits 55 each connected to the HV voltage bus 23. The switching circuits 55 as shown control operation of a high/upper or low/lower semiconductor switch 34 or 134, respectively. Thus, the semiconductor switches 34 and 134 may be considered part of a given switching circuit 55, or as separate therefrom, in different embodiments. As used herein and in the art, the terms "high switch" and "upper switch" refer to semiconductor switches connected to a higher potential/positive (+) rail of a low-voltage drive circuit used to power the switching circuits 55, i.e., having a voltage that is lower than that of the DC voltage bus 23, while "low switch" or "lower switch" refers to semiconductor switches connected to the lower potential rail, such as the indicated negative (−) bus rail.

A DC link capacitor ($C_L$) may be placed across the positive (+) and negative (−) bus rails upstream of the switching circuits 55. The terms "upstream" and "downstream" as used herein indicate relative position with respect to a driven load, in this instance the phase windings/AC voltage bus 123 of the electric machine 26 shown in FIG. 1. Thus, a given hardware component located in closer proximity to the driven load is also described herein as "downstream" relative to hardware components that are located farther away from the driven load.

As will be appreciated by those of ordinary skill in the art, the semiconductor switches 34 and 134 may be used as part of the PIM 24 in the exemplary application shown in FIG. 1, and thus may be operable for inverting a DC voltage to an AC voltage and vice versa as needed, e.g., in response to binary switching control/modulation signals sent as part of the output signals (arrow $CC_O$) from the microcontroller 50. However, the example three-phase implementation of FIG. 2, i.e., with its three switching pairs of upper switches 34 and lower switches 134, is exemplary and non-limiting, with other possible applications of the switching circuits 55 disclosed above, e.g., as part of the APM 19 of FIG. 1.

The microcontroller 50 receives circuit measurements from the plurality of sensors 21, shown as sensors 21A, 21B, and 21C in FIG. 2 for three example circuit measurements, with the microcontroller 50 doing so as part of the collective set of input signals (arrow $CC_I$). For instance, a given sensor 21A, 21B, and 21C may be used to measure a respective one of the bus voltage (VDC) on the DC voltage bus 23, the above-noted individual phase currents ($I_{PH}$), and a temperature of the switching circuit 55, e.g., a switch junction or chip temperature of a physical chip on which the semiconductors switches 34 and 134 reside.

Responsive to these circuit measurements, the microcontroller 50 calculates and/or accesses a lookup table from memory (M), with the example lookup table indexed or referenced by such circuit measurements. The microcontroller 50 uses the circuit measurements to calculate/select corresponding switching control values and Gate resistor identities, and to transmit, as part of the output signals (arrow $CC_O$), binary on/off switching control signals and a Gate resistor selection signal to the switching circuit(s) 55, as will now be described with reference to FIG. 3.

Figure 3:
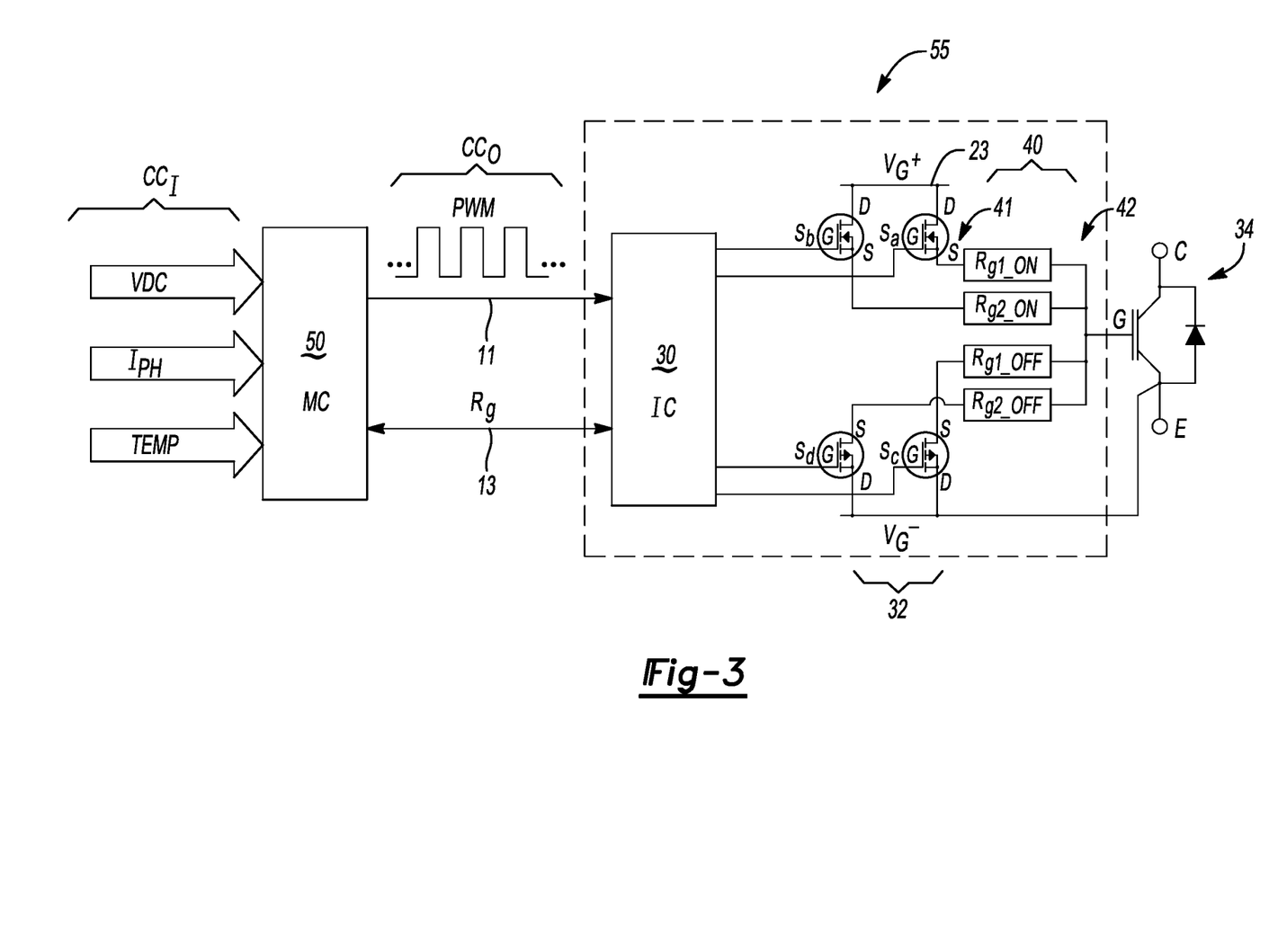
FIG. 3 is a schematic illustration of a portion of the switching circuit topology of FIG. 2 for a corresponding example semiconductor switch.

FIG. 3 depicts the switching circuit 55 for a given semiconductor switch, in this instance an upper semiconductor switch 34. Each of the upper and lower semiconductor switches 34 and 134 of FIG. 2 has a corresponding switching circuit 55, with just one semiconductor switch 34 and switching circuit 55 depicted in FIG. 3 for illustrative clarity. A single microcontroller 50 may be used to control the various switching circuits 55, e.g., via SPI or another suitable communications protocol as noted above. The microcontroller 50 receives the above-noted circuit measurements, such as the measured bus voltage (VDC), instantaneous phase currents ($I_{PH}$), and temperature (TEMP), in order to determine a corresponding operating region, e.g., of the driven load, as disclosed in more detail below with particular reference to FIG. 5. Based on the identified operating region, the microcontroller 50 transmits binary (on/off) switching control signals 11, e.g., PWM signals as shown, PDM signals, or signals generated using other suitable modulation techniques, and a Gate resistor ($R_g$) selection signal 13 to an optional Gate driver integrated circuit (IC) 30 of the switching circuit 55, or directly from the microcontroller 50.

Downstream of the Gate driver IC 30 in the illustrated embodiment, two pairs of buffer switches 32 (i.e., four buffer switches 32) are disposed on the positive (+) and negative (−) rails powering the switches 32. That is, the switches (Sa, Sc) and (Sb, Sd) form the two pairs of buffer switches 32, and are respectively connected to the above-noted positive (+) and negative (−) bus rails (low voltage relative to the high-voltage bus 23 of FIG. 1) to form high and low switches of the indicated pairs, respectively. A different number of buffer switches 32 may be used in other implementations. That is, while four buffer switches 32 (two switches 32 on the positive rail and two switches on the negative rail) may be used to selected three operating regions in the example that follows below, one may use more buffer switches 32 in other embodiments, e.g., to implement additional operating regions. For instance, three switches 32 on each of the positive and negative rails may be used to facilitate up to seven different operating regions, and so forth.

The switching circuit 55 further includes two pairs of Gate resistors 40, specifically first, second, third, and fourth Gate resistors 40 respectively labeled $R_{g1\_ON}$, $R_{g2\_ON}$, $R_{g1\_OFF}$, and $R_{g2\_OFF}$. Again, the actual number of Gate resistors 40 may vary with the intended application, with at least four such Gate resistors 40 being envisioned in the illustrated example embodiments. Each of the Gate resistors 40 has a respective input/upstream end 41 and output/downstream end 42, with the downstream ends 42 of each of the Gate resistors 40 electrically connected to a Gate terminal (G) of the semiconductor switch 34 controlled by the switching circuit 55. The Emitter terminal (E) and collector terminal (C) of the semiconductor switch 34 are also depicted, with the remaining components of the electrical circuit 51 of FIG. 2 omitted from FIG. 3 for simplicity.

The buffer switches 32 (Sa, Sb, Sc, and Sd), i.e., respective first, third, second, and fourth buffer switches 32, also have respective Gate terminals (G). When configured as example MOSFETs as shown, the buffer switches 32 have a respective Source terminal (S) connected to the input/upstream ends 41 of the Gate resistors 40. The respective Drain terminals (D) of the same buffer switches 32 are therefore connected to positive (+) voltage of the drive circuit, i.e., $V_G^+$ for the two upper buffer switches (Sa and Sb), and to negative (−) voltage bus rail ($V_G^-$) for the two lower switches (Sc and Sd).

As shown, the optional Gate driver IC 30 may be connected to the Gate terminals (G) of the buffer switches 32, such that the Gate driver IC 30, responsive to instructions from the microcontroller 50, controls the on/off state of the buffer switches 32. In this manner, the Gate driver IC 30 may be used to control the voltage level delivered to the Gate terminal (G) of the semiconductor switch 34, in this instance depicted as an IGBT. The microcontroller 50 is in communication with the Gate driver IC 30 for each semiconductor switch 34 that is in operation, and is configured, responsive to the set of circuit measurements contained in the input signals ($CC_I$), to access its memory (M) and lookup tables possibly residing therein. The optional lookup table(s) are indexed or referenced by the received circuit measurements, which allows the microcontroller 50 to select mode-appropriate switching control values and Gate resistor identities from the lookup table based on the circuit measurements, and to transmit the on/off switching control signals 11 and the Gate resistor selection signal 13 to the Gate driver IC 30 to thereby select a respective on/off state of each the buffer switches 32.

The circuit topology of the switching circuit 55 shown in FIG. 3 may be modified in some embodiments to provide added protection of the semiconductor switch 34. This may be accomplished using an optional active or a passive clamp circuit 45 or 46 as respectively shown in FIGS. 4A and 4B, both of which are electrically connected to the semiconductor switch 34 and configured to reduce the Gate voltage to the semiconductor switch 34 in response to a threshold voltage across the semiconductor switch 34, but operating in different manner. Other possible approaches include use of a desaturation (DESAT) fault detection circuit, or the use an IGBT on-die current sensor to detect a short-circuit/overcurrent condition. In such an embodiment, the circuit topology may forego use of a clamp circuit such as the example clamp circuits 45 and 46 of FIGS. 4A and 4B, respectively.

Figure 4A:
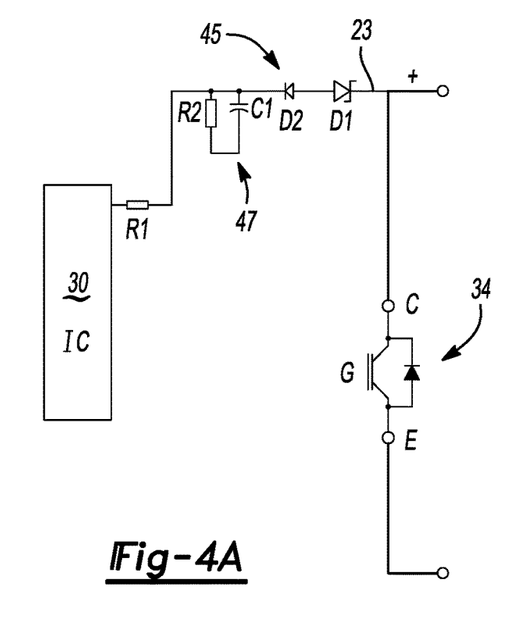
FIGS. 4A and 4B respectively depict active and passive embodiments of an optional clamp circuit usable within the switching circuit topology of FIG. 3.

In the actively-controlled/active embodiment of FIG. 4A, the clamp circuit 45 is positioned between the Gate driver IC 30 and the collector terminal (C) of the semiconductor switch 34. The clamp circuit 45 may include a Zener diode (D1) in series with a diode (D2) and a resistor (R1). An RC pair 47 (resistor R2 and capacitor C1) is disposed between diode (D1) and resistor (R1), with the clamp circuit 45 configured to protect the semiconductor switch 34 from excessive voltage during a fault condition.

Figure 4B:
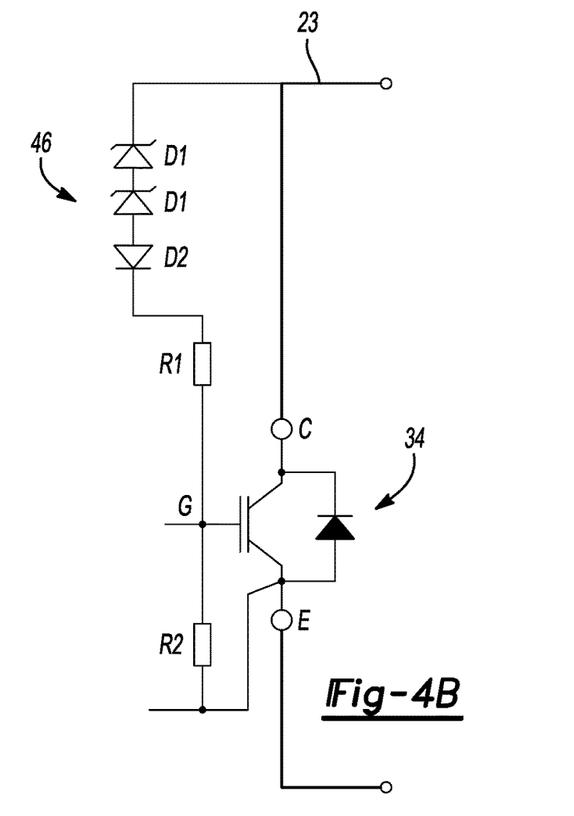

In operation, if the buffer switches 32 and/or the Gate resistors 40 shown in FIG. 3, which are omitted from FIGS. 4A and 4B for clarity, were to somehow fail or stop working as intended, the control voltage delivered to the Gate (G) of the semiconductor switch 34 could overshoot rated voltage limits of the semiconductor switch 34. The Zener voltage of the Zener diode (D1) may be selected such that, when the Zener voltage is exceeded, a current is free to flow through diode (D2) and resistor (R1) to the Gate driver IC 30. The current may be read by the Gate driver IC 30, which causes the Gate driver IC 30 to respond with an appropriate switching control action of the buffer switches 32, possibly informing the microcontroller 50 of a particular fault and/or discontinuing the switching operation of the semiconductor switch 34.

The passively-controlled/passive embodiment of FIG. 4B and the illustrated clamp circuit 46 operates to the same effect, but does so in a manner that does not require programmed functionality of or control by the Gate driver IC 30. Thus, the clamp circuit 46 is not connected to the Gate driver IC 30. The resistors (R1) and (R2) of FIG. 4A are rearranged as shown, with one or two series Zener diodes (D1) feeding current during a voltage overshoot condition back to the Gate terminal (G) of the semiconductor switch 34. The circuit topology of FIG. 4B therefore reduces the switching speed of the semiconductor switch 34 by effectively reducing its Gate voltage, or the potential across the semiconductor switch 34.

Figure 5:
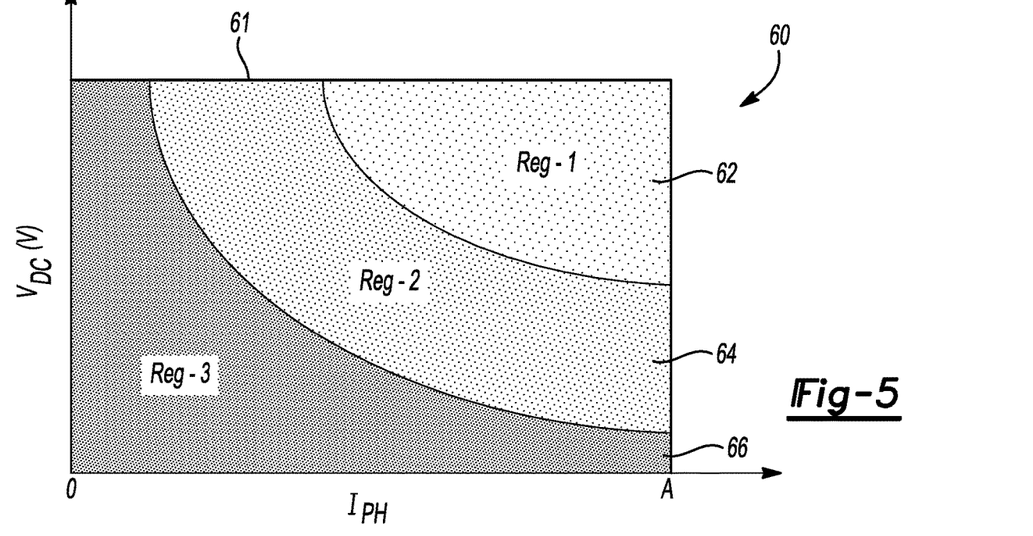
FIG. 5 is a map of discrete temperature-specific operating regions, with phase current depicted on the horizontal axis and bus voltage depicted on the vertical axis.

FIG. 5 presents an exemplary performance map 60 defining a plurality of different operating regions that may be used in the control of the switching circuit 55 shown in FIGS. 1-3. In a non-limiting example embodiment, three distinct operating regions 62, 64, and 66 are respectively labeled Reg-1, Reg-2, and Reg-3 for added clarity. The performance map 60 is referenced or indexed by the instantaneous phase current ($I_{PH}$) on the horizontal axis, with the current depicted in amps (A), and bus voltage ($V_{DC}$) on the vertical axis. A perimeter 61 of the performance map 60 forms the above-noted worst-case scenario defined in terms of bus voltage and phase current. While three operating regions 62, 64, and 66 are depicted in the illustrative embodiment of FIG. 5, more than three or as few as two operating regions may be used within the scope of the disclosure to provide a desired amount of control precision. The various regions may be defined by corresponding power level, i.e., voltage x current. The microcontroller 50 may select a region based on the present power level, or divide the regions into sub-regions, etc., using calculated power or other suitable parameters. Therefore, the illustrated example application is not intended to be limiting.

Figure 6:
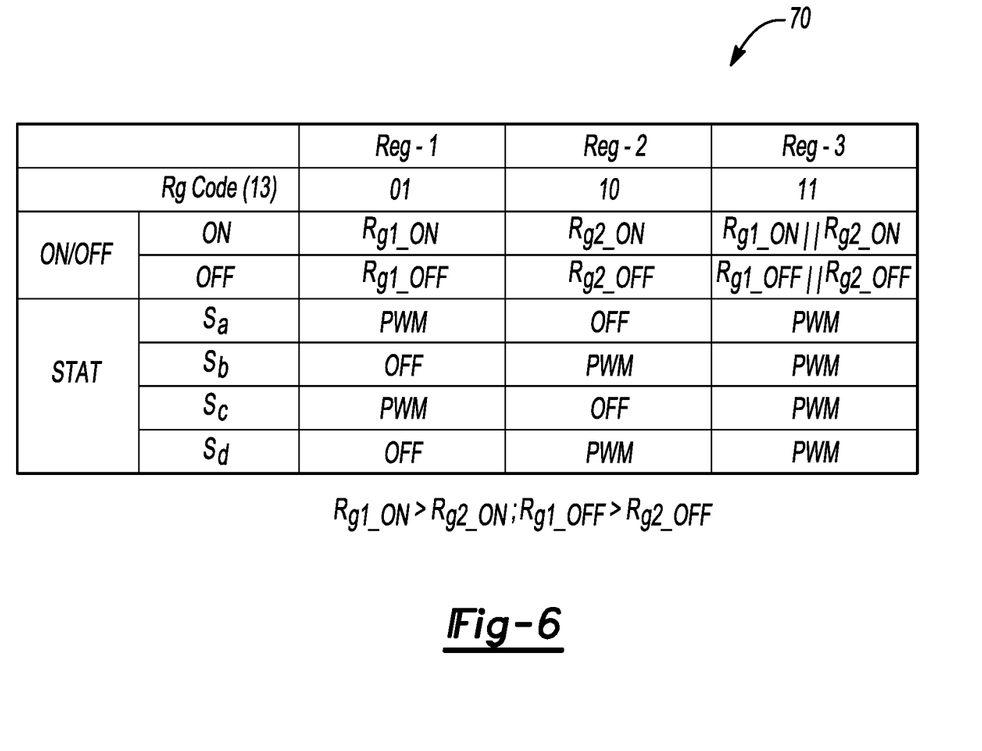
FIG. 6 is an example embodiment of a lookup table usable with the operating regions of FIG. 5.

Referring to FIG. 6, an example lookup table 70 may be recorded in memory (M) of the microcontroller 50 shown in FIGS. 1 and 2. The information in the lookup table 70 corresponds to the embodiment of FIG. 5, and thus lists three operating regions (Reg-1, Reg-2, and Reg-3). Other implementations may use two operating regions or more than three operating regions depending on the desired level of performance refinement. The lookup table 70 also includes a Gate resistor code (Rg Code (13)) corresponding to the Gate resistor selection signal 13 of FIG. 3, e.g., a numeric bit code such as 01, 10, and 11 that the microcontroller 50 ultimately transmits to the Gate driver IC 30.

In other words, the microcontroller 50, which is in communication with the Gate driver IC 30, may automatically access the lookup table 70 responsive to receipt of the above-noted set of circuit measurements to select appropriate switching control values, or otherwise calculate or determine such values, which are shown as "PWM" and "OFF" in FIG. 6, and Gate resistor identities of the particular Gate resistors 40 encoded as the Gate resistor selection signal 13. The Gate driver IC 30 receives such information from the microcontroller 50. In response, the Gate driver IC 30 transmits switching control signals (e.g., PWM) to the buffer switches 32 (Sa, Sb, Sc, Sd) to individually select the corresponding ON/OFF conducting state of each the buffer switches 40 as shown. Also, the relationship between Rg1 and Rg2 is such that Rg1_OFF is invariably greater than Rg2_OFF, but the same is not necessarily true for the ON resistors. Thus, the selection of the actual values of the Gate resistors may be determined experimentally/off-line for a given application.

When operating in region 62 (Reg-1) of FIG. 5, for example, both the bus voltage and the phase currents are high. Buffer switches 32 (Sa and Sc) are controlled via PWM or other switching control signals 11 and the other pair of buffer switches 32 (Sb and Sd) are turned and held off. Thus, the Gate resistors 40 labeled Rg1_ON and Rg1_OFF in FIG. 3 will lie in the conductive path from the actively-controlled buffer switches 32 to the Gate terminal (G) of the semiconductor switch 34. Temperature may be considered as part of the present approach, e.g., when operating in region 62 with low chip or switch junction temperature, one may use faster turn-off.

In region 64 of FIG. 5 (Reg-2), the pair of buffer switches 32 (Sb and Sd) are controlled via the switching control signals 11, and the pair of buffer switches 32 (Sa and Sc) are turned and held off. Thus, the Gate resistors labeled Rg2_ON and Rg2_OFF in FIG. 3 are placed in the conductive path from the actively-controlled buffer switches 32 to the Gate terminal (G) of the semiconductor switch 34.

Operation in region 66 (Reg-3) of FIG. 5 is reserved for lower power operation relative to power levels of regions 62 (Reg-1) and 64 (Reg-2). Here, the buffer switches 32 (Sa, Sb, Sc, and Sd) are actively controlled and the four Gate resistors 40 are placed in conductive paths to the Gate terminal (G). As will be evident to one of ordinary skill in the art when viewing FIGS. 5 and 6, the microcontroller 50 is able to selectively reduce the Gate resistance to the semiconductor switch 34 as bus voltage (VDC) decreases, doing so by selecting specific buffer switches 32 to actively switch and specific buffer switches 32 to turn and hold in an off state. As a result of selectively reducing the Gate resistance before the Gate terminal (G) to the semiconductor switch 34 based on voltage or current at a given junction temperature, the switching speed of the semiconductor switch 34 may be increased during lower power operating modes, while the Gate resistance may be increased to reduce switching speed during higher power modes.

Figure 7:
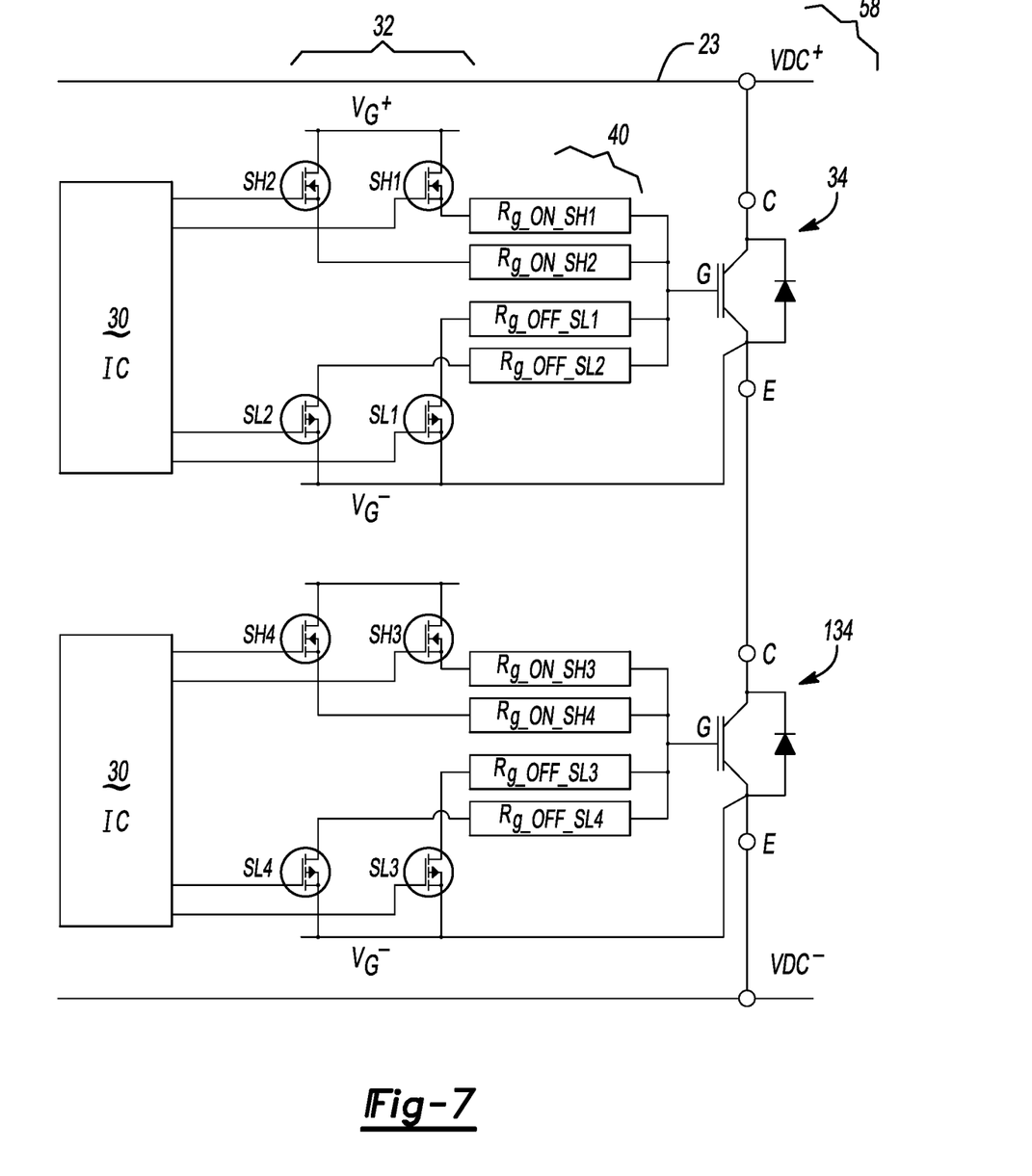
FIG. 7 is an example phase leg having upper/high and lower/low semiconductor switches and corresponding Gate driver ICs.

FIG. 7 depicts an example phase leg 58 having semiconductor switches 34 and 134 arranged as the respective upper and lower switches. Thus, the semiconductor switch 34 is connected to the positive (+) rail and semiconductor switch 134 is connected to the negative (−) rail of the DC voltage bus 23. Two separate Gate driver ICs 30 are used to control operation of the switches 34 and 134. Omitted from FIG. 7 for clarity and simplicity is the microcontroller 50 of FIGS. 1-3. The buffer switches 32 controlling semiconductor switch 34 are labeled SH1, SH2, SL1, and SL2, with "H" representing the high-side/upper switch location and "L" representing the low-side/lower switch location. Likewise, the buffer switches 32 of the semiconductor switch 134 are labeled SH3, SH4, SL3, and SL4 using the same nomenclature. Each of the switches 34 and 134 therefore has two pairs of buffer switches 32, with each pair having high-side and low-side switches, shown again as example MOSFETs.

FIGS. 1-7, therefore, may be used to implement a switching control strategy when powering a driven load, such as but not limited to the example electric machine 26 of FIG. 1. For instance, such a strategy may include receiving the set of circuit measurements via the microcontroller 50, then selecting the switching control values and Gate resistor identities from a lookup table, e.g., the lookup table 70 of FIG. 6, based on the set of circuit measurements. The microcontroller 50 then transmits on/off switching control signals 11 and a Gate resistor selection signal 13 (FIG. 3), respectively corresponding to the switching control values and the Gate resistor identities from the lookup table 70, to the Gate driver IC 30 to thereby select a respective on/off state of the buffer switches 32 when driving the electric machine 26 or another driven load.

Figure 8:
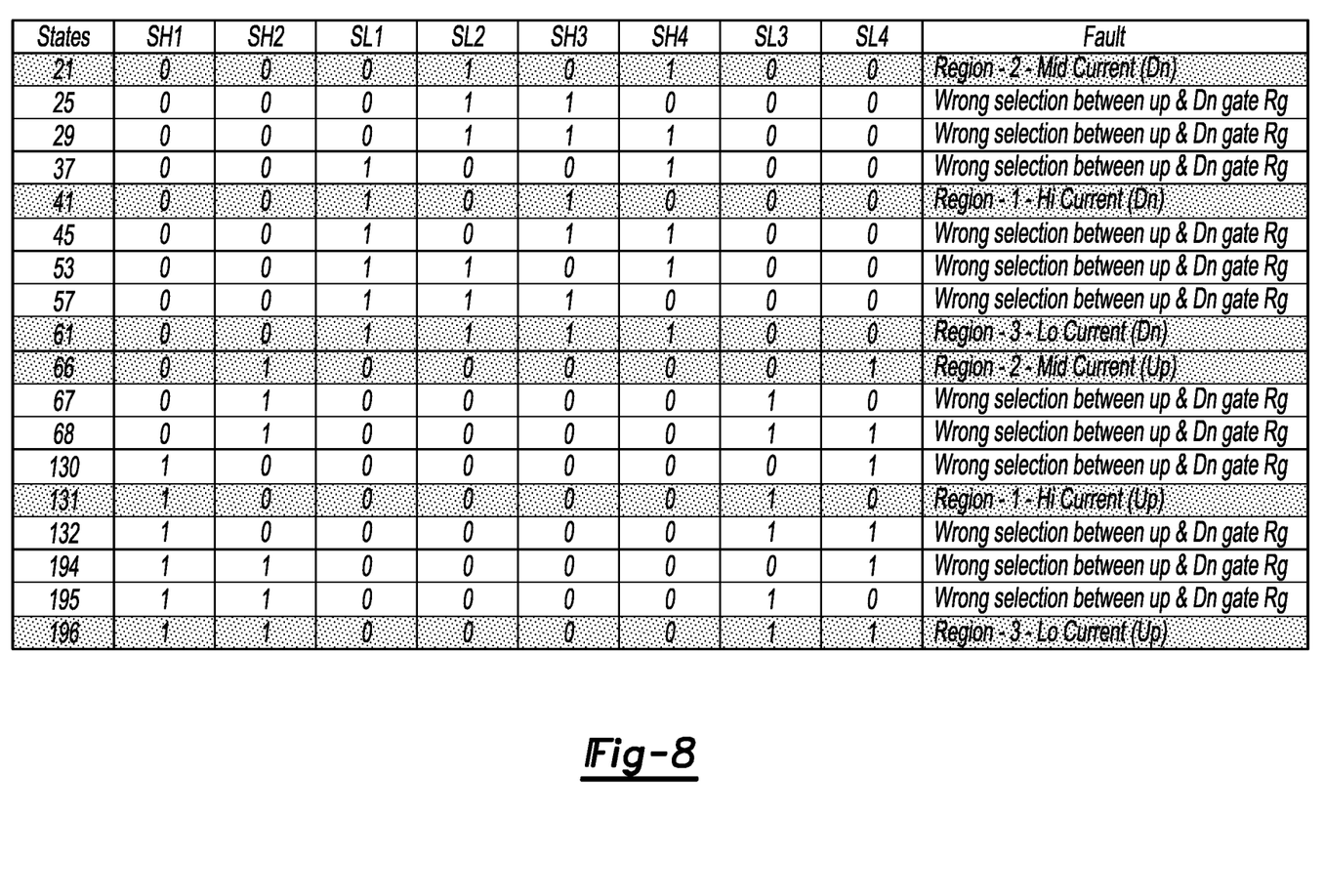
FIG. 8 is a fault lookup table describing an example set of fault conditions of the disclosed circuit topology of FIG. 7.
Figure 9:
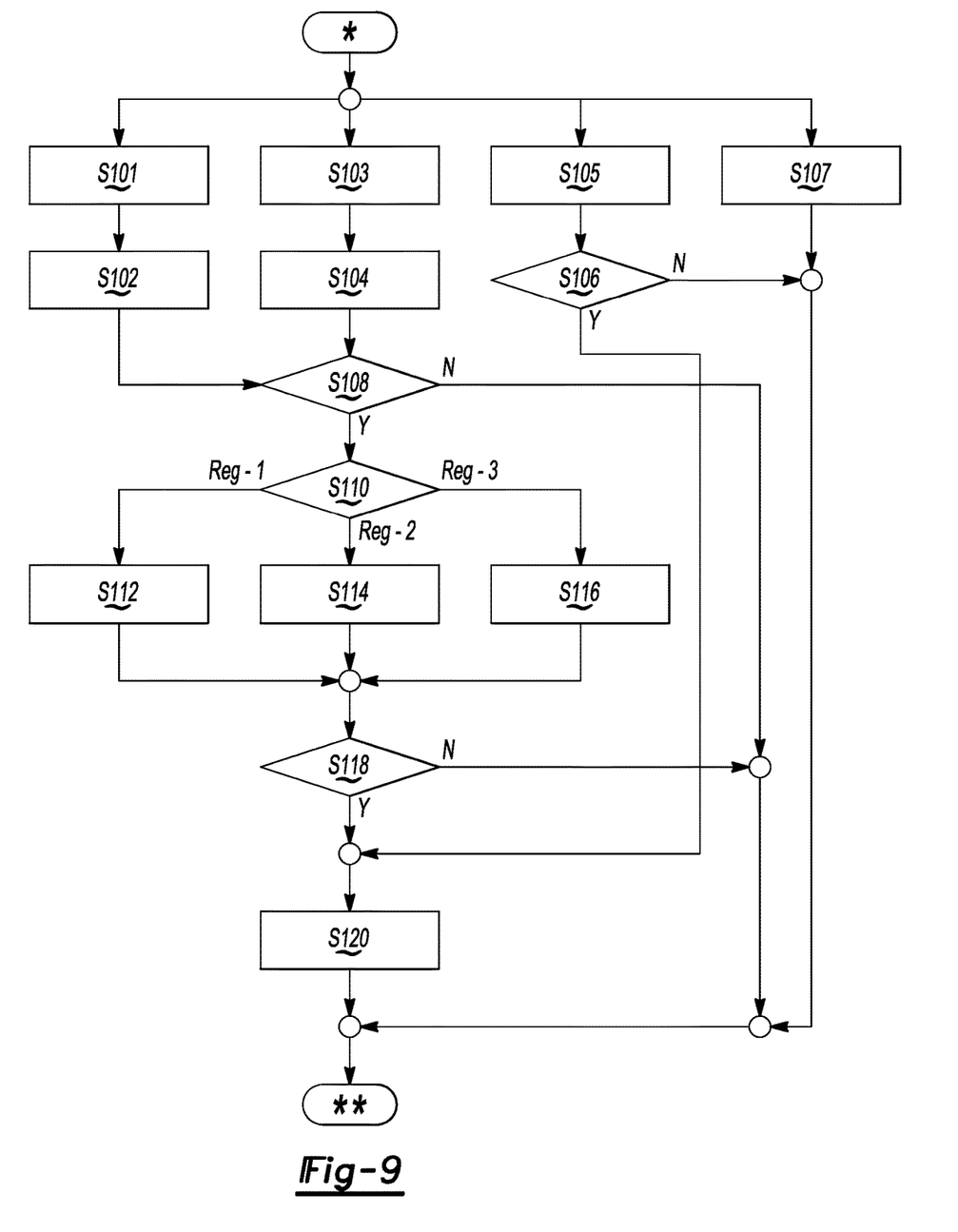
FIG. 9 is a flow chart describing a possible implementation of a method for controlling the switching topology of FIGS. 2 and 3.

Fault diagnosis according to the method 100 may be understood with reference to FIGS. 8 and 9. Although such faults may remain undetected at particular switching events, the method 100 triggers fault codes in other switching states or regions. It is possible for some faults to remain undetected for a few switching instances. In the presence of a high DC-link voltage across the capacitor $C_L$ of FIG. 2, for instance, lower than a target Gate resistance may trigger high voltage overshoot across the semiconductor switch 34 or 134 during turn-off. Such a failure mode may be avoided, e.g., active miller clamping, transient voltage suppression (TVS) diodes such as in the above-described active clamp circuit of FIG. 4A, or on-chip current sensing when used in conjunction with bus voltage measurements to effect optimum switching.

The microcontroller 50, therefore, may be programmed with a table of fault codes corresponding to different logic state combinations of the buffer switches 32, and to execute a control action using a table of fault codes, doing so responsive to detecting one of the 256 total possible logic state combinations, eighteen of which are shown in FIG. 8, and twelve of which correspond to an incorrect selection of the Gate resistors.

That is, nominal state numbers are shown at far left in FIG. 8. With eight total buffer switches 32 depicted in FIG. 7, there are $2^8$ different logic states that can result, i.e., 256 total unique logic states. Each logic state is assigned a unique identifier number in the range of 1 to 256 in logic of the microcontroller 50. Of the 256 possible logic states, six of the states are normal (N) operating states and 238 of them are fault states. The remaining twelve fault states (F) are unique to the present topology, with such logic states (F) resulting in the incorrect selection of Gate resistors and associated Gate resistance thereof, with this result labeled "Inc. Rg". Therefore, desired treatment of faults may be encoded in memory (M) of the microcontroller 50 and used in the ongoing control of the switching circuit 55.

An example embodiment of the method 100 is depicted in FIG. 9. Use of the method 100 provides a way to handle certain faults in real-time in a system employing the disclosed switching circuit 55. The microcontroller 50, for instance, may be programmed with a table of corresponding fault codes corresponding to the different logic states. The buffer switches 32 forming a given switching pair, i.e., (Sa and Sc) or (Sb and Sd) of FIG. 3, should have opposite conducting states, i.e., when switch (Sa) is ON/conducting, switch (Sc) is OFF/non-conducting, and vice versa. Thus, as will be appreciated, certain faults such as overcurrent/shoot-through or a current imbalance may be present when the buffer switches 32 of a given switch pair are both ON or OFF at the same time, or are ON or OFF in a manner that is different than expected for a given switching state. Therefore, different switching faults may be detected by the microcontroller 50 in real-time by evaluating the respective logic states of the individual buffer switches 32.

Beginning after initialization (*) of the microcontroller 50, and with reference to control of a single example semiconductor switch 34 for simplicity, the microcontroller 50 detects defined faults at steps S101, S103, S105, and S107. The microcontroller 50 may detect the presence of such faults using reported on/off logic state signals or measured voltages, or other suitable detection strategies.

At step S101, the microcontroller 50 determines if an overcurrent/shoot-through condition of the semiconductor switch 34 has been detected. The method 100 proceeds to step S102 when such an overcurrent/shoot-through condition is detected.

Step S102 includes terminating the Gate voltage to the semiconductor switch 34 to thereby turn off the semiconductor switch 34, and then recording a corresponding fault code in memory (M) of the microcontroller 50 before proceeding to step S108.

At step S103, the microcontroller 50 determines if a current imbalance fault condition is detected. The method 100 proceeds to step S104 when such a fault condition is detected.

At step S104, the microcontroller 50 records a corresponding fault code in its memory (M) before proceeding to step S108.

Step S105 includes detecting an incorrect selection of the Gate resistors 40, with examples of such logic states shown in FIG. 8. The method 100 proceeds to step S106 when this condition is detected.

Step S106 includes determining whether the clamp circuit 45 of FIG. 4A has been triggered. If so, the method 100 proceeds to step S120. Otherwise, the method 100 is complete (**).

Step S107 includes detecting normal operation, i.e., the absence of a fault condition. Normal operation may coincide with the logic states labeled "N" in FIG. 8, for instance. The method 100 is complete (**) when normal operation is detected.

At step S108, the microcontroller 50 waits a calibrated amount of time to determine if the fault conditions detected at step S101, S103, or S105 persist. The method 100 proceeds to step S110 when the faults persist after the calibrated duration elapses. The method 100 is complete (**) when the faults clear themselves, or otherwise no longer persist.

At step S110, the microcontroller 50 identifies a present operating region, e.g., from among the three example operating regions 62, 64, and 66 shown in FIG. 5. The method 100 proceeds to step S112 when the microcontroller 50 determines that operation is ongoing in region 62 (Reg-1), to step S114 when the microcontroller 50 detects operation in region 64 (Reg-2), and to step S116 when operating in region 66 (Reg-3).

Step S112 includes setting region 62 (Reg-1) as "unavailable" in logic of the microcontroller 50, and then limiting further operation to region 64 (Reg-2) as a control action. As a result, power, torque, and current are effectively reduced in the controlled system, e.g., the exemplary powertrain system 10 of FIG. 1. In the event operation in region 64 (Reg-2) is unavailable to the microcontroller 50, such as due to imposed operating limits on the electric machine 26 or other driven load, thermal limits, or other defined limits, the microcontroller 50 may record a diagnostic code in memory (M) indicative of the defined regions 62, 64, and 66 being unavailable to the microcontroller 50 as control options. The method 100 then proceeds to step S118.

Step S114 includes setting region 64 (Reg-2) as "unavailable" in logic of the microcontroller 50, and then limits further operation to region 62 (Reg-1) as a control action. Power, torque, current, etc., of the controlled system are effectively increased. In the event operation in region 62 (Reg-1) is unavailable to the microcontroller 50, such as for the reasons set forth above with reference to step S112, the microcontroller 50 may record a diagnostic code in memory (M) indicative of regions 62, 64, and 66 being unavailable as control options. The method 100 then proceeds to step S118.

Step S116 includes setting region 66 (Reg-3) as "unavailable" in logic of the microcontroller 50, and then limits operation to region 64 (Reg-2) as a control action. As a result, power, torque, and current of the controlled system are increased. In the event operation in region 64 (Reg-2) is unavailable to the microcontroller 50, such as for the reasons set forth above with reference to step S112, the microcontroller 50 may limit operation to region 62 (Reg-1) and record a diagnostic code in memory (M) indicative of region 62 operation. If operation in regions 62, 64, and 66 are unavailable as control options, the microcontroller 50 may record another diagnostic code in memory (M) indicative of such a result. The method 100 then proceeds to step S118.

At step S118, the microcontroller 50 determines if regions 62, 64, and 66 are unavailable. As noted above, when a given region 62, 64, or 66 becomes unavailable due to applicable limits, a diagnostic code is recorded. Thus, step S118 may include verifying the presence or absence of such diagnostic codes in memory (M) of the microcontroller 50. The method 100 proceeds to step S120 when operation in regions 62, 64, and 66 is not available as a control option. If one or more of the regions 62, 64, and 66 is available, the method 100 is finished (**).

Step S120 includes executing a control action responsive to the unavailability of regions 62, 64, and 66. Such a control action may entail shutting down operation of the PIM 24 shown in FIG. 1 or other device using the switching circuit 55.

Figure 10:
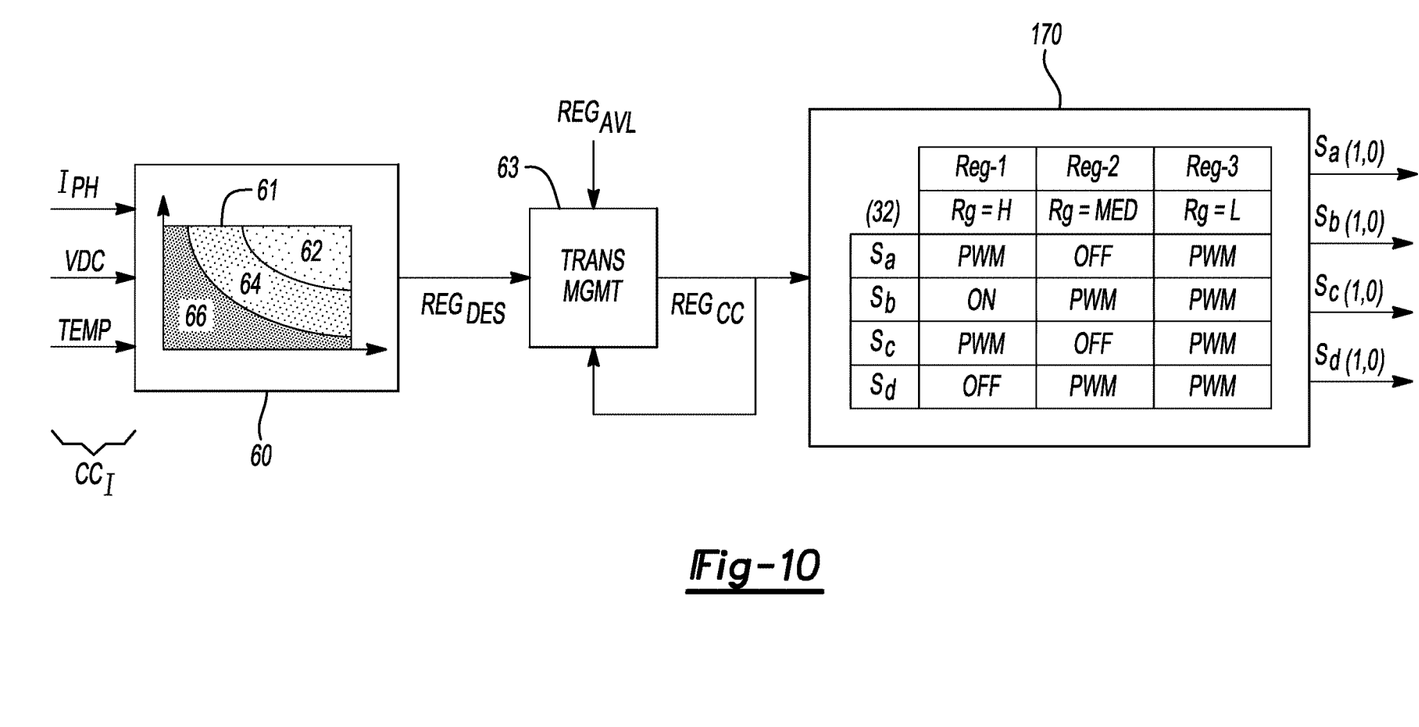
FIG. 10 is a schematic flow diagram depicting a possible implementation of the present method in the exemplary powertrain system of FIG. 1.

FIG. 10 is a schematic flow diagram depicting a possible implementation of the above teachings, e.g., when used with the powertrain system 10 of FIG. 1. The input signals ($CC_I$) are measured and fed into the performance map 60 described above with reference to FIG. 5, with the microcontroller 50 comparing the received input signals ($CC_I$) to the defined regions 62, 64, and 66 of the performance map 60 to determine a desired operating region ($REG_{DES}$) corresponding to the input signals ($CC_I$). The method 100 of FIG. 9 is used at the same time to determine available regions ($REG_{AVAIL}$) as present control options.

The desired operating region ($REG_{DES}$) and the available regions ($REG_{AVAIL}$) are then fed into a transition management logic block (TRANS MGMT) 63 to determine which region to command. Edges between the defined regions 62, 64, and 66 are farther from the design corner point (i.e., higher phase currents, highest DC voltage, and lowest chip or junction temperature). Therefore, a hysteresis loop may be implemented as the transition management logic block (TRANS MGMT) 63 to avoid noise, and to confirm smooth transition between the regions 62, 64, and 66.

Also, depending on the maximum amplitudes or values of the input signals ($CC_I$), i.e., of the instantaneous phase currents ($I_{PH}$), the DC bus voltage (VDC), and the temperature (TEMP), there is a maximum of four (4) instances of changing the Gate resistance selection code in one fundamental electrical cycle of motor current. Thus, the topology of FIG. 10 may be configured to consider sensor delay, processing delay of the microcontroller 50, and signal propagation delay when selecting the region of operation. Region selection does not have to be at the switching frequency, but instead may occur at a slower rate that is more in line with the fundamental frequency of the electric machine 26.

The commanded region ($REG_{CC}$) is output by the transition management logic block 63 and fed into a state control logic block 65 that is populated with a lookup table 170. The lookup table 170 may be analogous to the above-described lookup table 70 of FIG. 6. The example lookup table 170 may list the various buffer switches 32, i.e., switches $S_a$, $S_b$, $S_c$, and $S_d$, and corresponding regions 62 (Reg-1), 64 (Reg-2), and 66 (Reg-3). As described above, the Gate resistances (Rg) decrease with a transition from region 62 (Reg-1) to region 64 (Reg-2), and from region 64 to region 66 (Reg-3). Based on the values contained in the lookup table 170, the microcontroller 50 outputs switching signals 13 of FIG. 1 as a corresponding binary state signals (1, 0), with a logic state of 1 commanding the indicated buffer switch 32 ($S_a$, $S_b$, $S_c$, $S_d$) to turn on and a state of 0 commanding the indicated buffer switch 32 to turn off. In this manner, optimum switching speeds for the semiconductor switch 34 are achieved.

The switching circuit 55, when constructed as described above, therefore enables instantaneous run-time decisions and implementations of mode-appropriate Gate resistance values to the semiconductor switch 34 exemplified in FIG. 3. Operation of the switching circuit 55 may help to maximize operational efficiency and safe operating area (SOA) of the semiconductor switch 34, i.e., the voltage, current, and junction temperature conditions over which the semiconductor switch 34 operates without damage.

Additionally, the present approach may facilitate commonality of the PIM 24 of FIG. 1 with different configurations of the RESS 22, such as different numbers of battery cells, as well as with different configurations of the electric machine 26. The present teachings can be used with other types of converters and other types of power switches other than those explicitly described herein. The resulting reduction in switching losses enjoyed from the enabled selective use of region-appropriate Gate resistance values, when the switching circuit 55 is used in the example powertrain system 10 of FIG. 1 or battery electric or fuel cell-powered alternatives, may help increase overall fuel economy or energy efficiency. These and other attendant benefits will be readily appreciated by those of ordinary skill in the art in view of the foregoing disclosure.

While some of the best modes and other embodiments have been described in detail, various alternative designs and embodiments exist for practicing the present teachings defined in the appended claims. Those skilled in the art will recognize that modifications may be made to the disclosed embodiments without departing from the scope of the present disclosure. Moreover, the present concepts expressly include combinations and sub-combinations of the described elements and features. The detailed description and the drawings are supportive and descriptive of the present teachings, with the scope of the present teachings defined solely by the claims.

What is claimed is:

1. A switching circuit comprising:
a semiconductor switch having a Gate terminal;

first, second, third, and fourth Gate resistors, each having an upstream end and a downstream end, wherein the downstream end of each of the Gate resistors is electrically connected to the Gate terminal of the semiconductor switch;

first, second, third, and fourth buffer switches each having a Gate terminal and a Source terminal, wherein the Source terminal of the first, second, third, and fourth buffer switches is connected to the upstream end of the first, second, third, and fourth Gate resistors, respectively;

a plurality of sensors; and a microcontroller in communication with the buffer switches and the plurality of sensors and configured to receive a set of circuit measurements from the plurality of sensors, and in response to the set of circuit measurements, to:
- determine switching control values and Gate resistor identities based on the set of circuit measurements; and
- transmit on/off switching control signals and a Gate resistor selection signal to the buffer switches to thereby select a respective on/off state for each of the buffer switches, the on/off switching control signals and the Gate resistor selection signal corresponding to the switching control values and Gate resistor identities.

2. The switching circuit of claim 1, further comprising: a Gate driver integrated circuit (IC) connected to the Gate terminal of each of the first, second, third, and fourth buffer switches, wherein the microcontroller is in communication with the Gate driver IC and is configured to transmit the Gate resistor selection signal to the Gate driver IC to thereby select the respective on/off state for each of the buffer switches.

3. The switching circuit of claim 2, wherein the Gate driver IC is programmed to command a default switching state of each of the first, second, third, and fourth buffer switches responsive to a threshold voltage.

4. The switching circuit of claim 1, wherein the microcontroller includes a lookup table indexed by the set of circuit measurements, and is configured to select the switching control values and the Gate resistor identities from the lookup table.

5. The switching circuit of claim 1, further comprising: a clamp circuit that is electrically connected to the semiconductor switch, and that is configured to increase a Gate voltage to the semiconductor switch in response to a threshold voltage across the semiconductor switch.

6. The switching circuit of claim 5, wherein the clamp circuit is a passive clamp circuit connected to the Gate terminal of the semiconductor switch, and having a Zener diode.

7. The switching circuit of claim 1, further comprising: a driven load connected to the semiconductor switch.

8. The switching circuit of claim 7, wherein the switching circuit is configured as part of an electrical system having a direct-current (DC) voltage bus and a polyphase electric machine driven by a plurality of phase currents, the set of circuit measurements includes a DC voltage level of the DC voltage bus, an instantaneous value of the phase currents, and a temperature of the semiconductor switch, and the driven load is a phase leg of the polyphase electric machine.

9. The switching circuit of claim 8, wherein the microcontroller is programmed with a performance map defining a plurality of different operating regions each indexed, at the temperature of the semiconductor switch, by the DC voltage level and the instantaneous value of the phase currents, and wherein the microcontroller is configured to determine a present operating region of the driven load on the performance map using the set of circuit measurements, and to actively switch at least some of the Gate resistors based on the present operating region.

10. The switching circuit of claim 1, wherein the microcontroller is programmed with a table of fault codes corresponding to a plurality of different logic state combinations of the buffer switches, and to execute a control action using the table of fault codes responsive to detecting one of the different logic state combinations.

11. The switching circuit of claim 10, wherein the table of fault codes includes 256 total fault codes, and wherein twelve of the 256 total fault codes correspond to an incorrect selection of the Gate resistors by the microcontroller.

12. A method for controlling a semiconductor switch connected to a driven load by a switching circuit, the method comprising:
receiving a set of circuit measurements via a microcontroller that is in communication with a Gate driver integrated circuit (IC), the Gate driver IC being connected to a respective Gate terminal of each of a first, second, third, and fourth buffer switch, wherein in the switching circuit:
- a respective downstream end of first, second, third, and fourth Gate resistors, relative to a location of the semiconductor switch, is connected to a Gate terminal of the semiconductor switch;
- each of the Gate resistors has a respective upstream end relative to the location of the semiconductor switch; and
- a respective Source terminal of each of the buffer switches is connected to the respective upstream ends of the Gate resistors;

determining switching control values and Gate resistor identities, using the microcontroller, based on the set of circuit measurements; and transmitting on/off switching control signals and a Gate resistor selection signal respectively corresponding to the switching control values and the Gate resistor identities, to the Gate driver IC via the microcontroller, to thereby select a respective on/off state of the first, second, third, and fourth buffer switches when driving the driven load.

13. The method of claim 12, wherein the semiconductor switch is an Insulated-Gate Bipolar Transistor (IGBT), and the buffer switches are Metal Oxide Field-Effect Transistors (MOSFETs).

14. The method of claim 12, further comprising: increasing a Gate voltage to the Gate terminal of the semiconductor switch, via a clamp circuit, in response to a threshold voltage across the semiconductor switch, the clamp circuit having at least one Zener diode, wherein the clamp circuit is electrically connected to at least one terminal of the semiconductor switch.

15. The method of claim 14, wherein the clamp circuit is an active clamp circuit connected to the Gate driver IC, the method further comprising:
individually commanding a default switching state of the first, second, third, and fourth buffer switches, via the Gate driver IC, responsive to the threshold voltage.

16. The method of claim 14, wherein the clamp circuit is a passive clamp circuit connected to two terminals of the semiconductor switch, and not connected to the Gate driver IC.

17. The method of claim 12, further comprising powering a polyphase electric machine as the driven load, wherein:
- the switching circuit is configured as part of an electrical system having a direct-current (DC) voltage bus and the polyphase electric machine; and
- the polyphase electric machine is driven by a plurality of phase currents, the set of circuit measurements include a voltage level of the DC voltage bus, an instantaneous value of the phase currents, and a temperature of the semiconductor switch.

18. The method of claim 17, wherein the microcontroller is programmed with a performance map defining a plurality of different operating regions indexed, at the temperature, by the voltage level and the instantaneous value of the phase currents, the method further comprising:
- determining a present operating region of the driven load on the performance map, via the microcontroller, using the set of circuit measurements; and
- actively switching at least some of the Gate resistors based on the present operating region.

19. The method of claim 12, wherein the microcontroller is programmed with a table of fault codes corresponding to a plurality of different logic state combinations of the buffer switches, the method further comprising: executing a control action using the table of fault codes responsive to detecting one of the plurality of different logic state combinations.

20. The method of claim 19, wherein the table of fault codes includes 256 total fault codes, and wherein twelve of the 256 total fault codes correspond to an incorrect selection of the Gate resistors by the microcontroller.

* * * * *